(12) United States Patent
Ong et al.

(10) Patent No.: US 12,733,485 B2
(45) Date of Patent: Sep. 8, 2026

(54) PASSIVE DEVICES IN BONDING LAYERS

(71) Applicant: Taiwan Semiconductor Manufacturing Company, Ltd., Hsinchu (TW)

(72) Inventors: Yi Ching Ong, Hsinchu (TW); Wei-Cheng Wu, Hsinchu County (TW); Chien Hung Liu, Hsinchu County (TW); Harry-Haklay Chuang, Zhubei City (TW); Yu-Sheng Chen, Taoyuan City (TW); Yu-Jen Wang, Hsinchu City (TW); Kuo-Ching Huang, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 639 days.

(21) Appl. No.: 18/155,569

(22) Filed: Jan. 17, 2023

(65) Prior Publication Data

US 2024/0088026 A1 Mar. 14, 2024

Related U.S. Application Data

(60) Provisional application No. 63/429,692, filed on Dec. 2, 2022, provisional application No. 63/404,789, filed on Sep. 8, 2022.

(51) Int. Cl.
*H10W 20/40* (2026.01)
*H01F 17/00* (2006.01)
(Continued)

(52) U.S. Cl.
CPC ...... *H10W 20/497* (2026.01); *H01F 17/0013* (2013.01); *H10D 1/20* (2025.01);
(Continued)

(58) Field of Classification Search
CPC ............. H01L 23/5227; H01F 17/0013; H01F 2017/0073
See application file for complete search history.

(56) References Cited

U.S. PATENT DOCUMENTS

2002/0005537 A1* 1/2002 Heo ....................... H10D 1/665 257/296
2006/0094132 A1* 5/2006 Liu ....................... H10P 74/235 257/E21.527
(Continued)

FOREIGN PATENT DOCUMENTS

CN 1893137 A * 1/2007 ........... B81B 3/0021
CN 109712943 A * 5/2019
(Continued)

OTHER PUBLICATIONS

Harry-Haklay Chuang et al., Backside Leakage Prevention, U.S. Appl. No. 17/824,391, filed May 25, 2022, Assignee: Taiwan Semiconductor Manufacturing Company, Ltd., 25 pages specification, 20 pages drawings.
(Continued)

*Primary Examiner* — William B Partridge
*Assistant Examiner* — Felix B Andrews
(74) *Attorney, Agent, or Firm* — HAYNES AND BOONE, LLP

(57) ABSTRACT

A semiconductor device according to embodiments of the present disclosure includes a first die including a first bonding layer and a second die including a second hybrid bonding layer. The first bonding layer includes a first dielectric layer and a first metal coil embedded in the first dielectric layer. The second bonding layer includes a second dielectric layer and a second metal coil embedded in the second dielectric layer. The second hybrid bonding layer is bonded to the first hybrid bonding layer such that the first
(Continued)

dielectric layer is bonded to the second dielectric layer and the first metal coil is bonded to the second metal coil.

20 Claims, 11 Drawing Sheets

(51) Int. Cl.
*H10D 1/20* (2025.01)
*H10W 20/20* (2026.01)
*H10W 70/685* (2026.01)

(52) U.S. Cl.
CPC ......... *H10W 20/20* (2026.01); *H10W 70/685* (2026.01); *H01F 2017/0073* (2013.01)

(56) References Cited

U.S. PATENT DOCUMENTS

2007/0145367 A1 6/2007 Chen
2013/0113448 A1 5/2013 Shapiro
2015/0255372 A1* 9/2015 Kamgaing ............ H10W 20/20 257/532
2017/0186732 A1* 6/2017 Chu ...................... H10W 90/00
2020/0295123 A1 9/2020 Shih
2021/0036097 A1* 2/2021 Tsai ....................... H10D 1/692
2024/0251567 A1* 7/2024 Matsuzaki ............. H10N 50/80

FOREIGN PATENT DOCUMENTS

KR 20220037947 A 3/2022
KR 20220037950 A 3/2022

OTHER PUBLICATIONS

Tsung-Chieh Hsiao et al., Semiconductor Package with Improved Heat Distribution, U.S. Appl. No. 17/830,861, filed Jun. 2, 2022, Assignee: Taiwan Semiconductor Manufacturing Company, Ltd., 22 pages specification, 17 pages drawings.

Harry-Haklay Chuang et al., High Bandwidth Package Structure, U.S. Appl. No. 17/831,040, filed Jun. 2, 2022, Assignee: Taiwan Semiconductor Manufacturing Company, Ltd., 26 pages specification, 14 pages drawings.

Feng-Chien Hsieh et al., Integration of Solar Cell and Image Sensor, U.S. Appl. No. 17/892,846, filed Aug. 22, 2022, Assignee: Taiwan Semiconductor Manufacturing Company, Ltd., 24 pages specification, 32 pages drawings.

* cited by examiner

PASSIVE DEVICES IN BONDING LAYERS

PRIORITY DATA

The present application claims the benefit of U.S. Provisional Application No. 63/404,789 filed Sep. 8, 2022, and U.S. Provisional Application No. 63/429,692 filed Dec. 2, 2022. The entire disclosures of which are herein incorporated by reference in their entirety.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Passive devices such as inductors and capacitors are needed in modern-day circuits to serve as, for example, voltage regulators and filters. Because passive devices may be much larger than transistors, they are usually implemented as discrete components and mounted on a printed circuit board (PCB). Transistors in dies that are bonded to the PCB have to be electrically connected to these discrete components via substantial routing. This long routing may result in increased resistance and power consumption.

BRIEF DESCRIPTION OF THE DRAWINGS

The embodiments of the present disclosure are best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
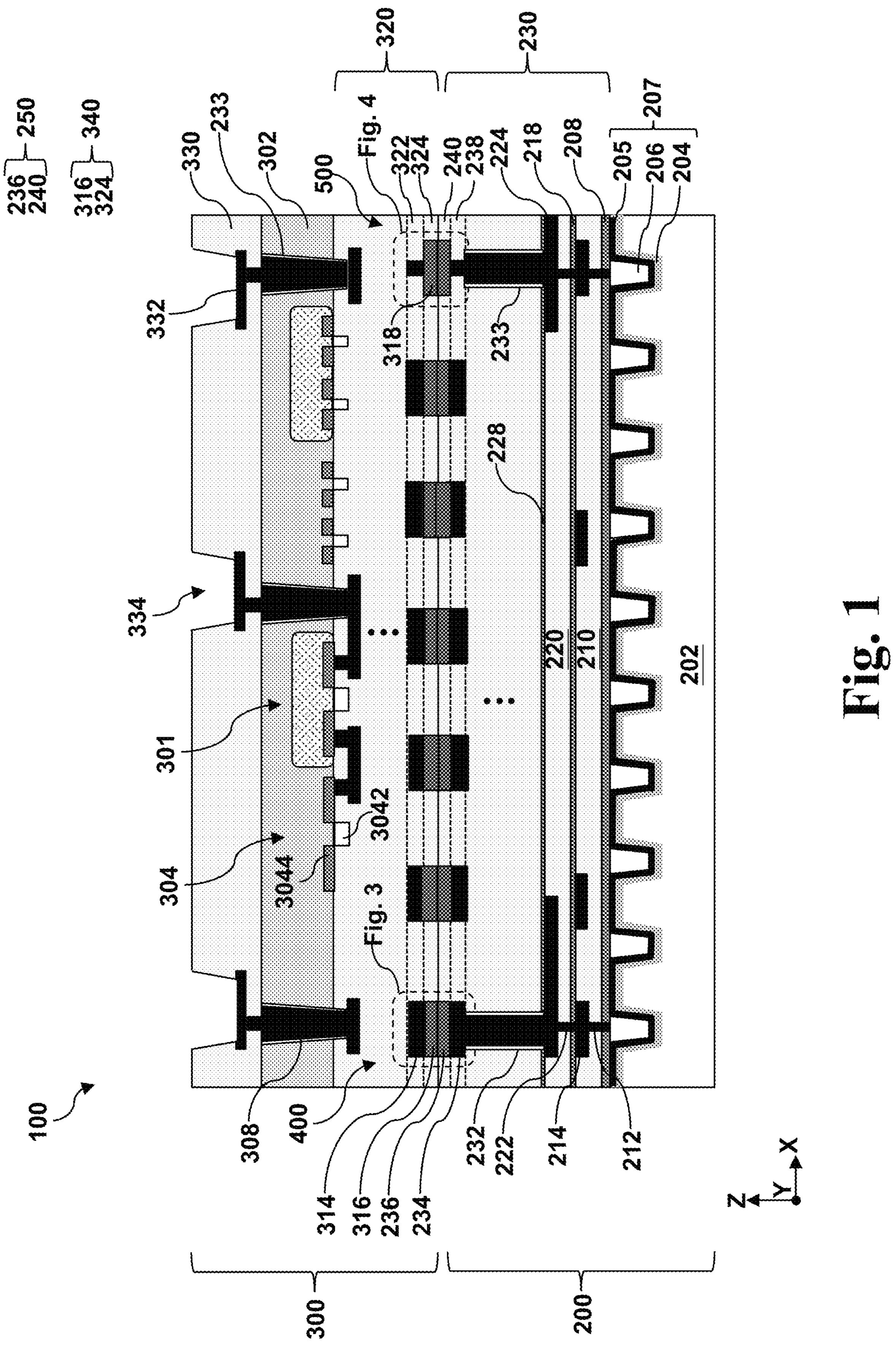
FIG. 1 illustrates a fragmentary cross-sectional view of a device package that includes a first passive device in the hybrid bond layers, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as “beneath,” “below,” “lower,” “above,” “upper” and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with “about,” “approximate,” and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of “about 5 nm” can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Passive devices such as inductors and capacitors are needed in modern-day circuits to serve as, for example, voltage regulators and filters. Because capacitors usually require large conductive plates and inductors usually require coils, they can be much larger than transistors. Oftentimes passive devices are implemented as discrete components and are mounted on a printed circuit board (PCB). Transistors in dies that are bonded to the PCB have to be electrically connected to these discrete components via substantial routing, including, for example, conductive features in an interconnect structure, micro-bumps, through-substrate vias, solder bumps, and conductive wires on the PCB. Such long routing may result in increased resistance and power consumption.

The embodiments of the present disclosure implement passive devices in the hybrid bonding layers that are used to bond dies together. When the passive device is an inductor, the bond features in hybrid bond layers are patterned to have a concentric square spiral shape, square zigzag shape, or a stripe shape. The bond features in the hybrid bond layers are vertically aligned to increase a thickness of the resulting inductor structure. In some embodiments, the bond contacts disposed over the bond features are also vertically aligned to further increase the thickness of the inductor structure. Because the inductors of the embodiments of the present disclosure are disposed between two bonded dies, not mounted on a PCB as discrete components, routing from the transistors to the inductors may be minimal. Additionally, as the bond features in the inductors are vertically aligned, they maintain their functions to bond the two dies.

Figure 2:
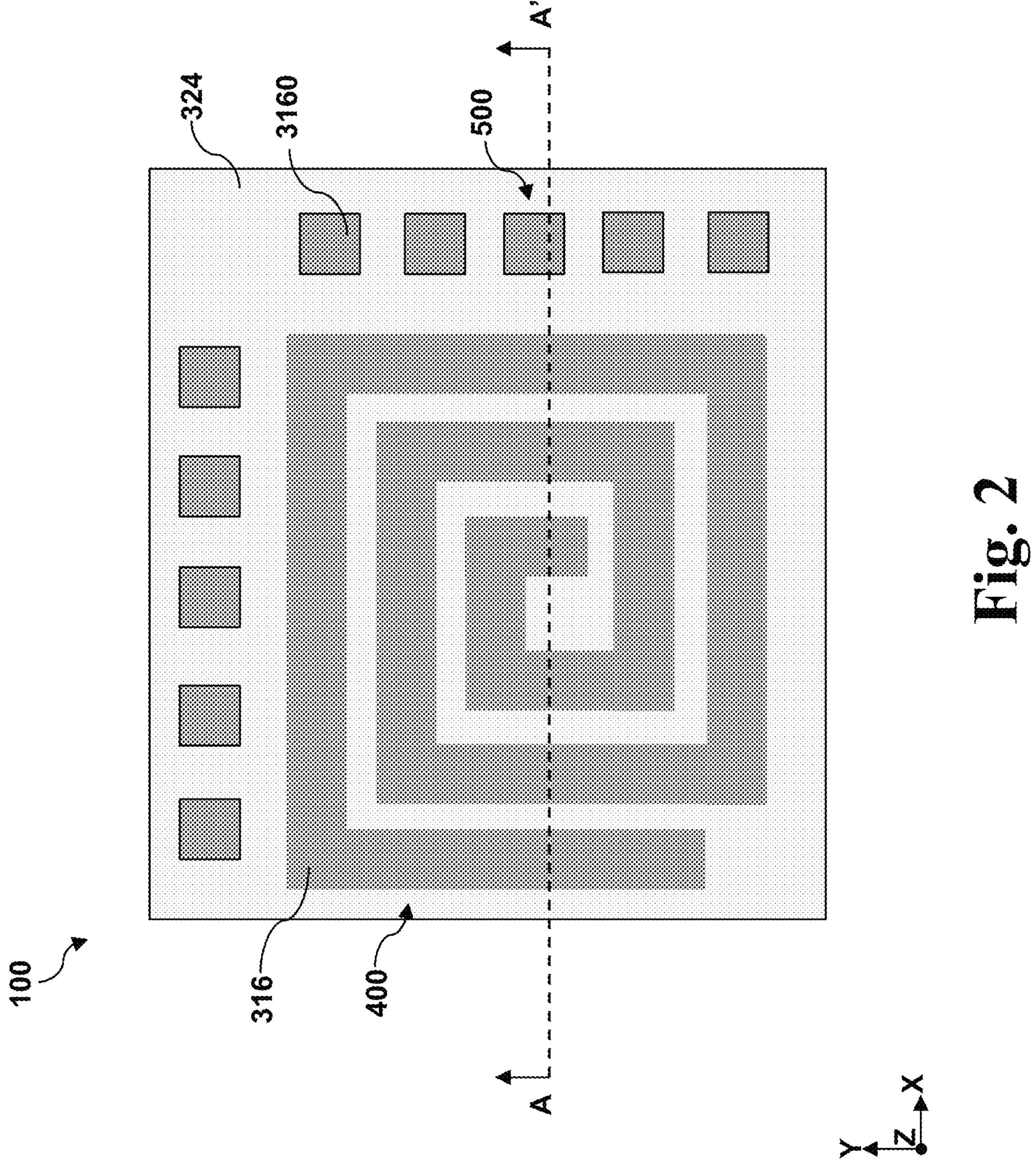
FIG. 2 illustrates a top view of the first passive device in FIG. 1, according to various aspects of the present disclosure.
Figure 3:
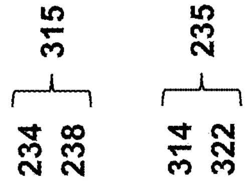
FIG. 3 illustrates a fragmentary perspective view of a first bond contact, a first bond feature, a second bond feature, and a second bond contact in the first passive device shown in FIG. 1, according to various aspects of the present disclosure.
Figure 3:
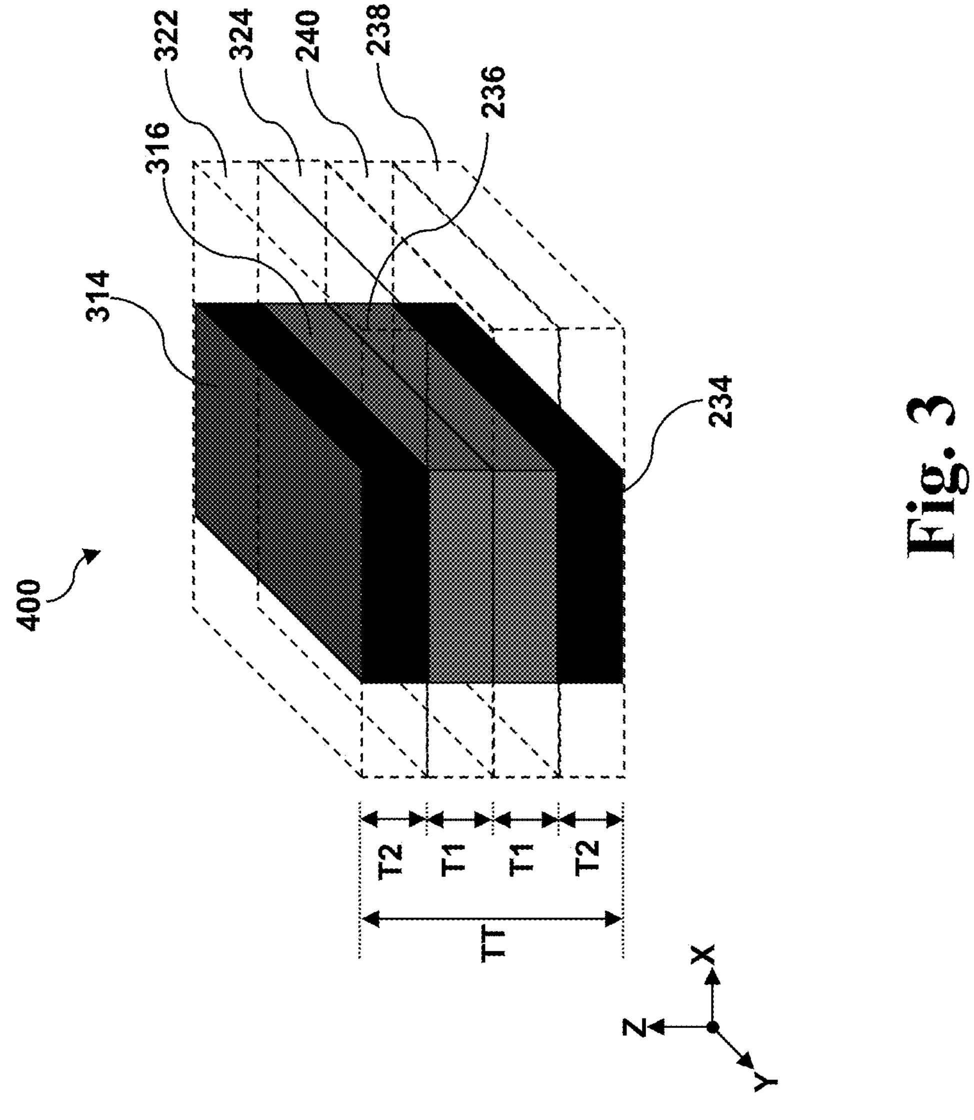
Figure 4:
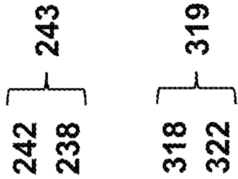
FIG. 4 illustrates a fragmentary perspective view of bond features and bond contacts outside of the first passive device shown in FIG. 1, according to various aspects of the present disclosure.
Figure 4:
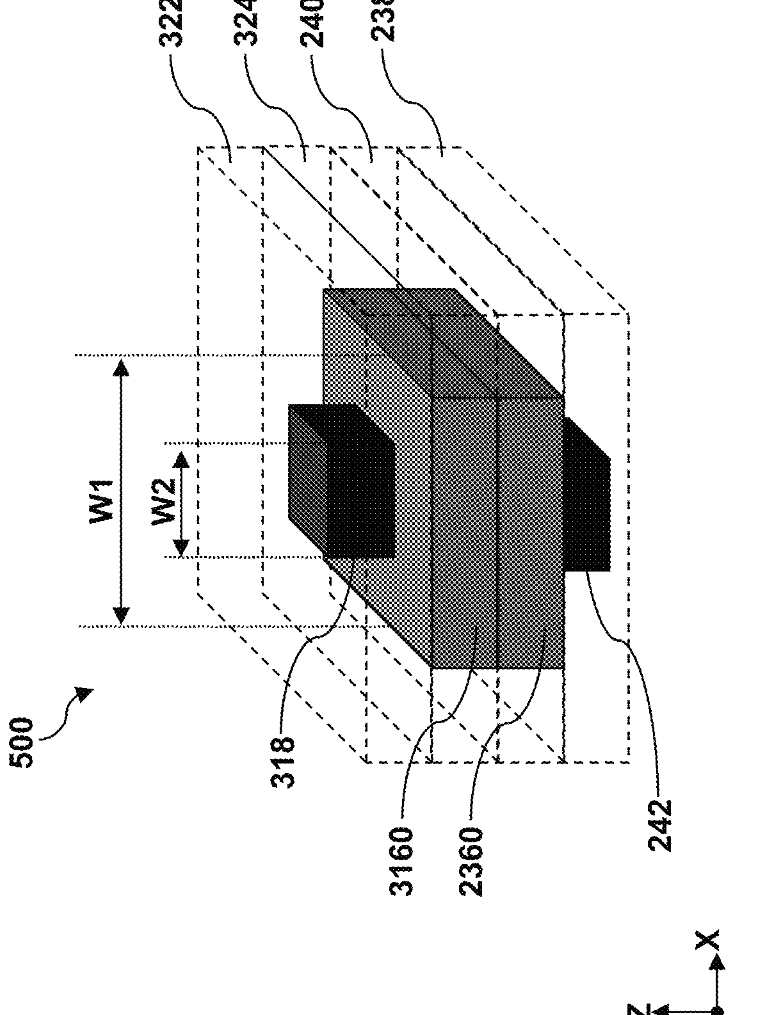
Figure 5:
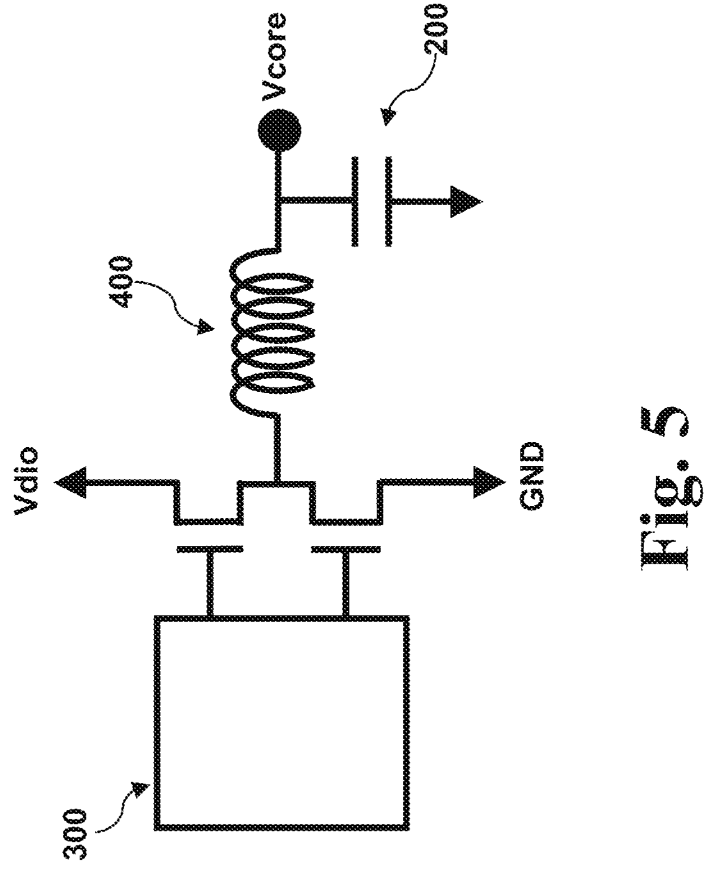
FIG. 5 illustrates an example equivalent circuit of the device package in FIG. 1, according to various aspects of the present disclosure.
Figure 6:
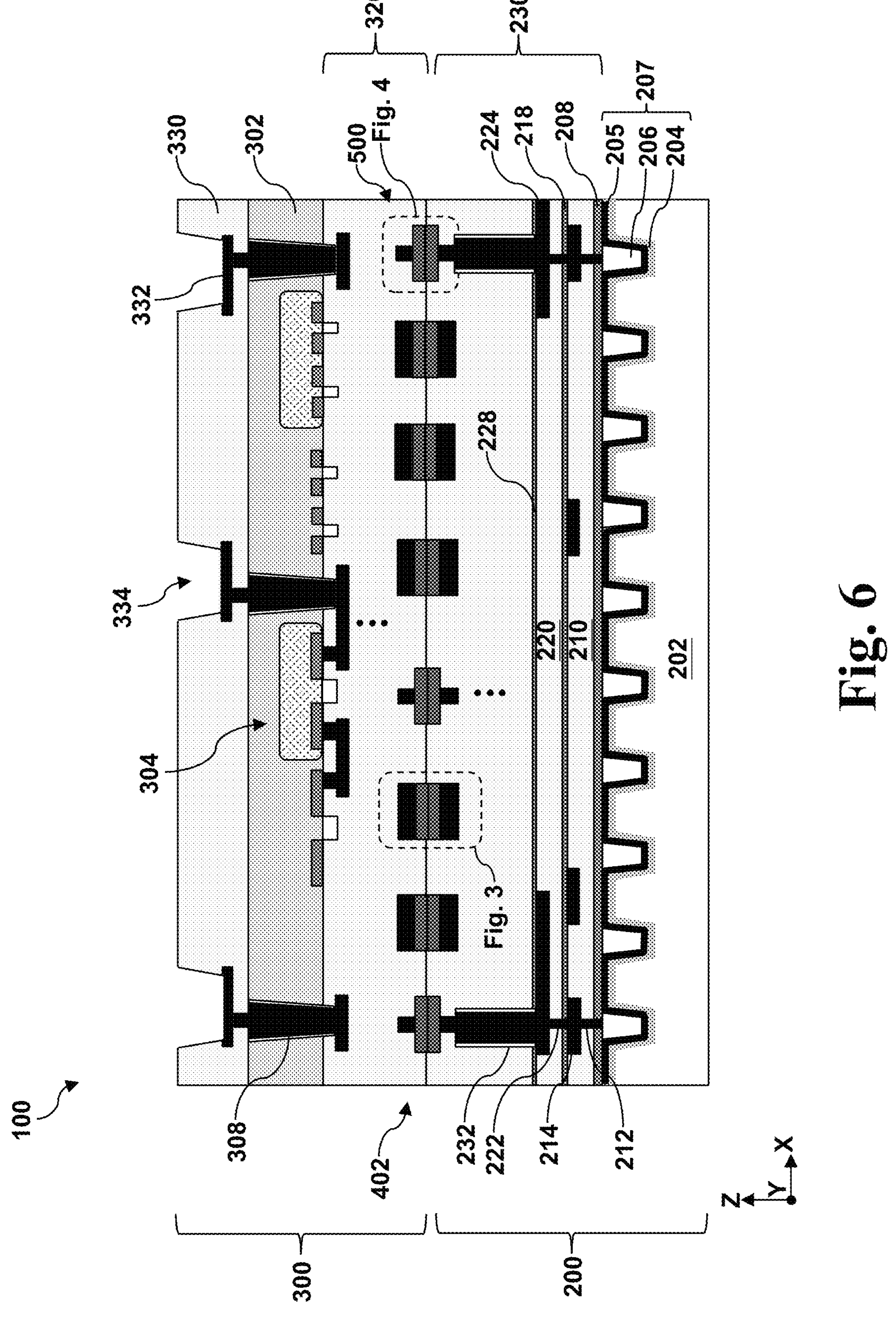
FIG. 6 illustrates a fragmentary cross-sectional view of a device package that includes a second passive device in the hybrid bond layers, according to various aspects of the present disclosure.
Figure 7:
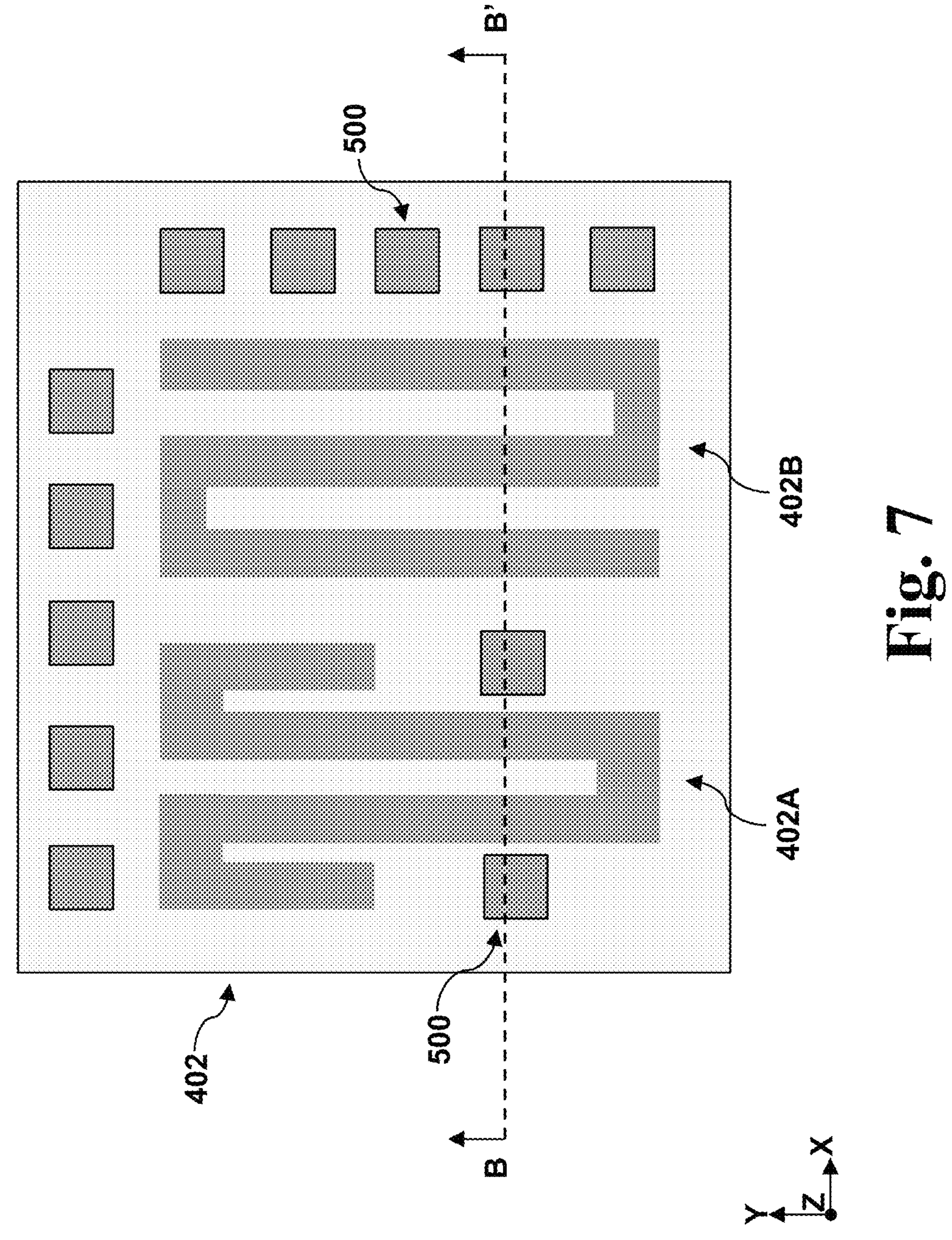
FIG. 7 illustrates a top view of the second passive device in FIG. 6, according to various aspects of the present disclosure.
Figure 8:
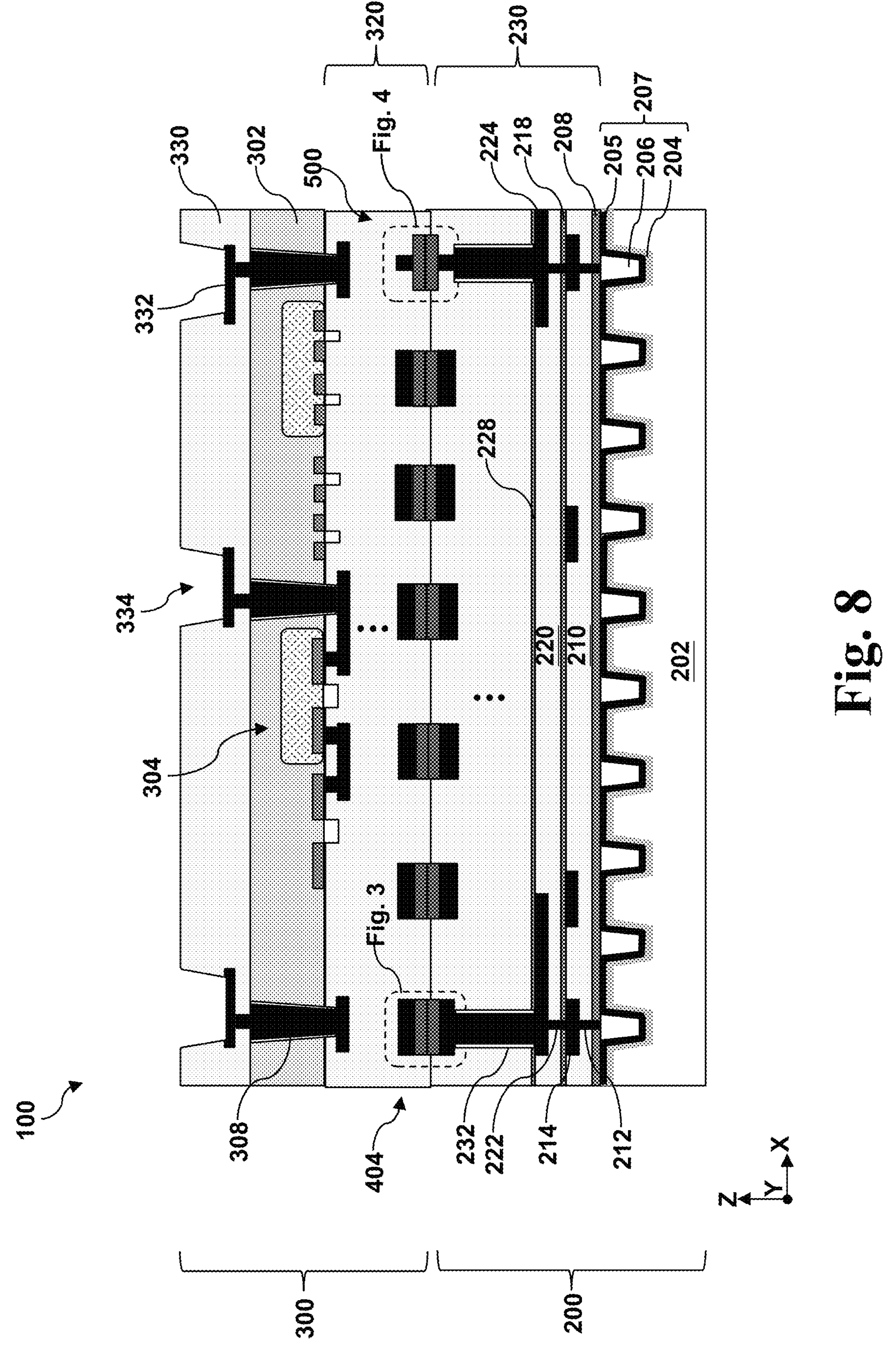
FIG. 8 illustrates a fragmentary cross-sectional view of a device package that includes a third passive device in the hybrid bond layers, according to various aspects of the present disclosure.
Figure 9:
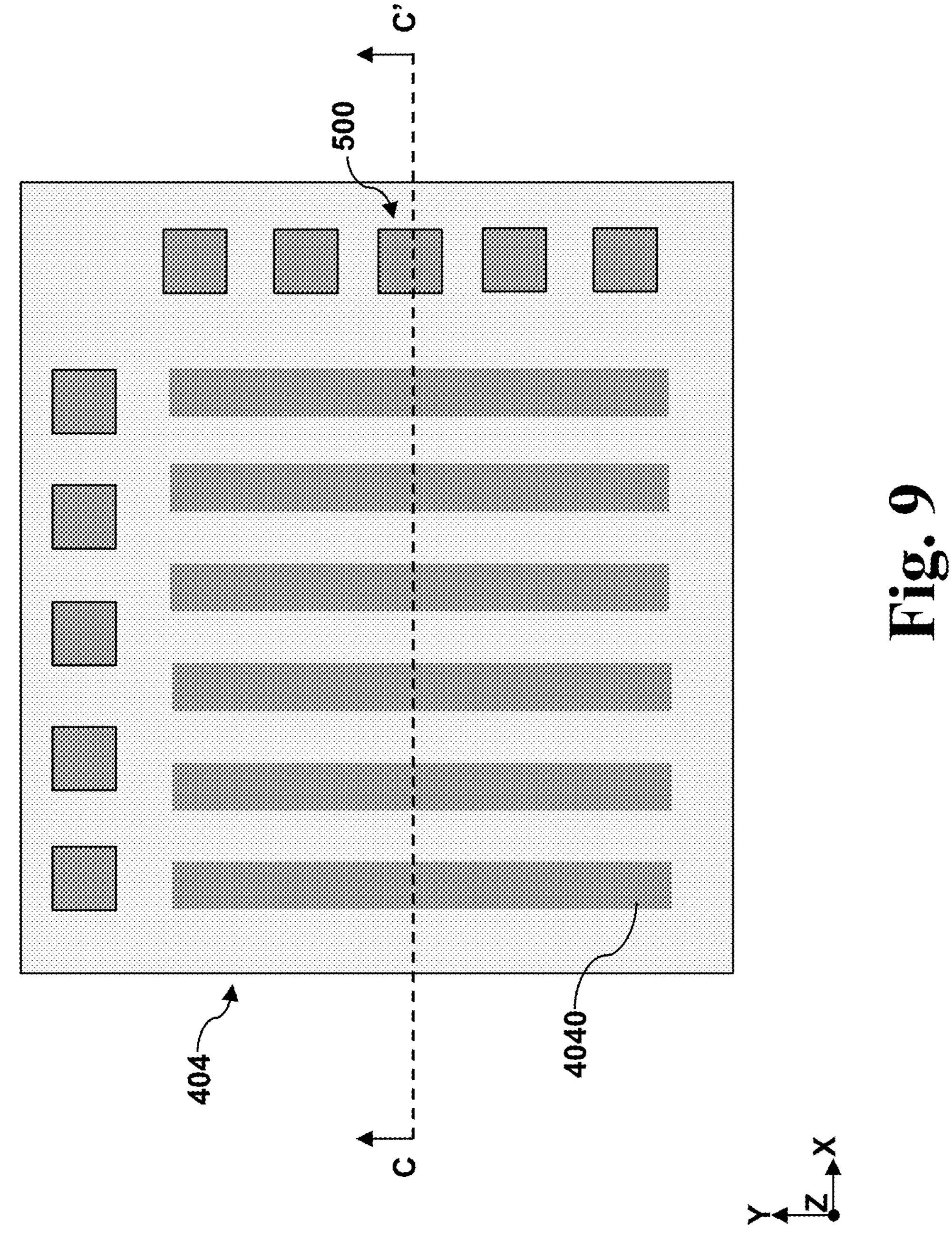
FIG. 9 illustrates a top view of the third passive device in FIG. 8, according to various aspects of the present disclosure.
Figure 10:
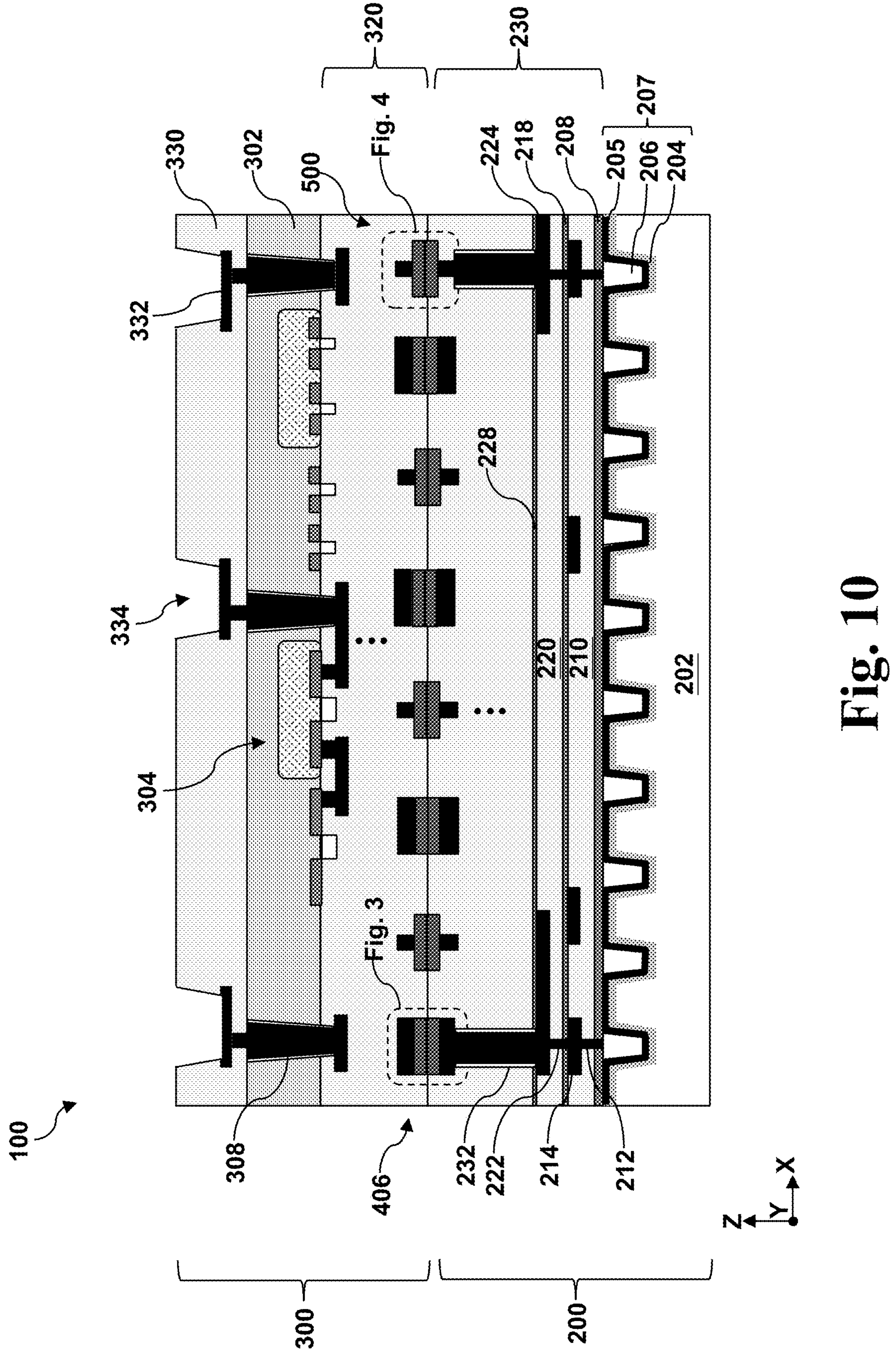
FIG. 10 illustrates a fragmentary cross-sectional view of a device package that includes a fourth passive device in the hybrid bond layers, according to various aspects of the present disclosure.
Figure 11:
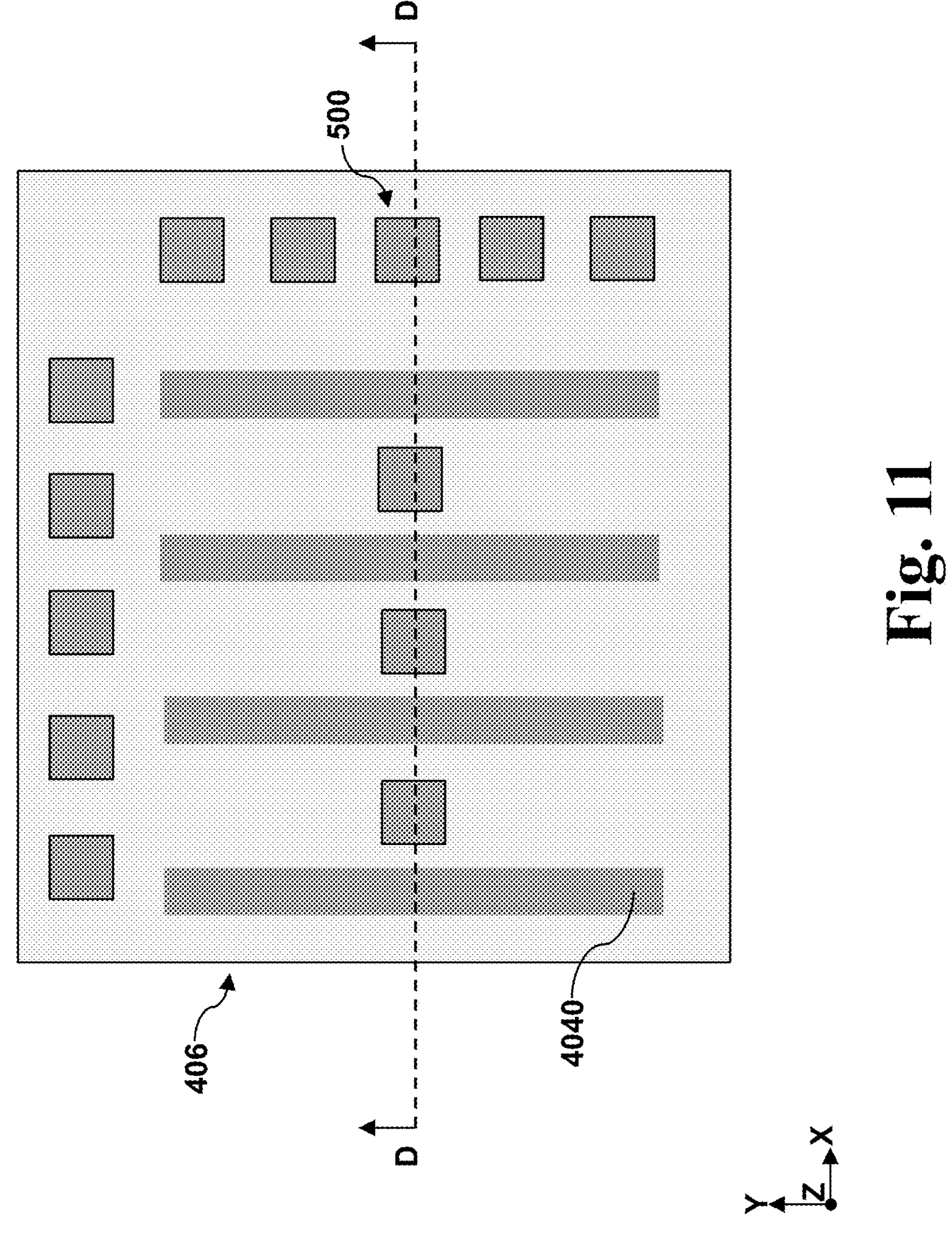
FIG. 11 illustrates a top view of the fourth passive device in FIG. 10, according to various aspects of the present disclosure.

The various aspects of the embodiments of the present disclosure will now be described in more detail with reference to the figures. In that regard, FIG. 1 illustrates a fragmentary cross-sectional view of a device package that includes a first passive device in hybrid bond layers, according to various aspects of the present disclosure. FIG. 2 illustrates a top view of the first passive device in FIG. 1. FIG. 3 illustrates a fragmentary perspective view of a first bond contact, a first bond feature, a second bond feature, and a second bond contact in the first passive device shown in FIG. 1. FIG. 4 illustrates a fragmentary perspective view of other bond features and bond contacts outside of the first passive device. FIG. 5 illustrates an example equivalent circuit of the device package in FIG. 1. FIG. 6 illustrates a fragmentary cross-sectional view of a device package that includes a second passive device in the hybrid bond layers. FIG. 7 illustrates a top view of the second passive device in FIG. 6. FIG. 8 illustrates a fragmentary cross-sectional view of a device package that includes a third passive device in the hybrid bond layers. FIG. 9 illustrates a top view of the third passive device in FIG. 8. FIG. 10 illustrates a fragmentary cross-sectional view of a device package that includes a fourth passive device in the hybrid bond layers. FIG. 11 illustrates a top view of the fourth passive device in FIG. 10. For avoidance of doubts, the X, Y and Z directions in FIGS. 1-4 and 6-11 are used consistently and perpendicular to one another. Throughout the embodiments of the present disclosure, unless expressly otherwise described, like reference numerals denote like features.

FIG. 1 illustrates a fragmentary cross-sectional view of a device package 100 that includes a first die 200 and a second die 300 flipped over and bonded to the first die 200. The first die 200 includes a first substrate 202, a deep trench capacitor (DTC) structure 207 fabricated on the first substrate 202, and a first interconnect structure 230 over the first substrate 202. The second die 300 includes a second substrate 302, a transistor 304 fabricated on the second substrate 302, and a second interconnect structure 320 over the second substrate 302. In an embodiment, both the first substrate 202 and the second substrate 302 include silicon (Si). Alternatively, the first substrate 202 and the second substrate 302 may include a compound semiconductor, such as silicon carbide (SiC), gallium arsenide (GaAs), gallium phosphide (GaP), indium phosphide (InP), indium arsenide (InAs), and/or indium antimonide; an alloy semiconductor, such as silicon germanium (SiGe), GaAsP, AlInAs, AlGaAs, GaInAs, GaInP, and/or GaInAsP; or combinations thereof. Alternatively, the first substrate 202 and the second substrate 302 may be semiconductor-on-insulator substrates, such as a silicon-on-insulator (SOI) substrates, silicon germanium-on-insulator (SGOI) substrates, or germanium-on-insulator (GeOI) substrates. Semiconductor-on-insulator substrates can be fabricated using separation by implantation of oxygen (SIMOX), wafer bonding, and/or other suitable methods. Both the first substrate 202 and the second substrate 302 can include various doped regions depending on design requirements. In some implementations, the first substrate 202 and the second substrate 302 include p-type doped regions (for example, p-type wells) doped with p-type dopants, such as boron (for example, BF 2), indium, other p-type dopant, or combinations thereof. In some implementations, the first substrate 202 and the second substrate 302 include n-type doped regions (for example, n-type wells) doped with n-type dopants, such as phosphorus (P), arsenic (As), other n-type dopant, or combinations thereof. In some implementations, the first substrate 202 and the second substrate 302 include doped regions formed with a combination of p-type dopants and n-type dopants. The various doped regions can be formed directly on and/or in the first substrate 202 and the second substrate 302, for example, to provide a p-well structure, an n-well structure, a dual-well structure, a raised structure, or combinations thereof. An ion implantation process, a diffusion process, and/or other suitable doping process can be performed to form the various doped regions. For illustration purposes, an n-well 301 is illustrated in FIG. 1.

The DTC structure 207 includes a lower electrode 204, a dielectric layer 205, and an upper electrode 206. In an example process, trenches are formed into the first substrate 202. A conductive layer is then conformally deposited over the trenches to form the lower electrode 204. In some embodiments, the conductive layer may include doped silicon, polysilicon, copper, tungsten, an aluminum copper alloy, titanium, titanium nitride, tantalum, tantalum nitride, a combination thereof. The dielectric layer 205 is then deposited over the lower electrode 204. In some implementations, the dielectric layer 205 may include hafnium oxide, aluminum oxide, zirconium oxide, or a combination thereof. Then the upper electrode 206 is formed over the dielectric layer 205. Like the lower electrode 204, the upper electrode 206 may include doped silicon, polysilicon, copper, tungsten, an aluminum copper alloy, titanium, titanium nitride, tantalum, tantalum nitride, a combination thereof.

Referring still to FIG. 1, the transistor 304 may be a planar transistor or a multi-gate transistor, such as a fin-like field effect transistor (FinFET) or a gate-all-around (GAA) transistor. A planar transistor includes a gate structure that may induce a planar channel region along one surface of its active region, hence its name. A FinFET includes a fin-shaped active region arising from a substrate and a gate structure disposed over a top surface and sidewalls of the fin-shaped active region. A GAA transistor includes at least one channel member extending between two source/drain features and a gate structure that wraps completely around the at least one channel member. Because its gate structure wraps around the channel member, a GAA transistor may also be referred to as a surrounding gate transistor (SGT) or a multi-bridge-channel (MBC) transistor. Depending on the shapes and orientation, a channel member in a GAA transistor may be referred to as a nanosheet, a semiconductor wire, a nanowire, a nanostructure, a nano-post, a nano-beam, or a nano-bridge. In some instances, a GAA transistor may be referred to by the shape of the channel member. For example, a GAA transistor having one or more nanosheet channel member may also be referred to as a nanosheet transistor or a nanosheet FET.

The transistor 304 representatively shown in FIG. 1 is a planar device that includes a gate structure 3042 disposed over a channel region of an active region disposed in the second substrate 302. The transistor 304 also includes source/drain regions 3044. While the transistor 304 is shown as a planar device in FIG. 1 and subsequent figures, it should be understood that the transistor 304 may as well be a FinFET or a GAA transistor.

While not explicitly shown, the gate structure 3042 includes an interfacial layer interfacing the channel region, a gate dielectric layer over the interfacial layer, and a gate electrode layer over the gate dielectric layer. The interfacial layer may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The gate dielectric layer may include a high-k dielectric material, such as hafnium oxide. Alternatively, the gate dielectric layer may include other high-K dielectric materials, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HTiO), $(Ba,Sr)TiO_3$ (BST), silicon nitride (SiN), silicon oxynitride (SiON), combinations thereof, or other suitable material. The gate dielectric layer may be formed by ALD, physical vapor deposition (PVD), CVD, oxidation, and/or other suitable methods.

The gate electrode layer of the gate structure may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof.

The source/drain regions 3044 may be doped regions in the active region or epitaxial features deposited using vapor-phase epitaxy (VPE), ultra-high vacuum CVD (UHV-CVD), molecular beam epitaxy (MBE), and/or other suitable processes. When the source/drain regions 3044 are n-type, it may include silicon (Si) doped with an n-type dopant, such as phosphorus (P) or arsenic (As). When the source/drain regions 3044 are p-type, it may include silicon (Si) or silicon germanium (SiGe) doped with a p-type dopant, such as boron (B) or boron difluoride ($BF_2$).

Although not explicitly shown in FIG. 1, multiple active regions like the active region are formed over the second substrate 302. The active regions may be isolated from one another by an isolation feature. In some implementations, the isolation features may be formed by etching a trench in the second substrate 302 or an epitaxial layer on the second substrate 302 using a dry etch process and filling the trench with insulator material using a chemical vapor deposition (CVD) process, flowable CVD (FCVD) process, or a spin-on glass process. A chemical mechanical polishing (CMP) process may be performed to remove excessive insulator material and to provide a planar surface. When the active regions are semiconductor fins or have fin-like structure, the insulator material is then etched back to form the isolation feature such that the active regions rises above the isolation feature. In some implementations, the isolation features may include a multi-layer structure that includes a liner dielectric layer and bulk dielectric layer. The isolation feature may include silicon oxide, silicon oxynitride, boron silicate glass (BSG), or phosphosilicate glass (PSG).

Referring to FIG. 1, each of the first interconnect structure 230 and the second interconnect structure 320 may include three (3) to sixteen (16) metal layers to functionally link the DTC structure 207 and the transistors 304. For ease of illustration, the various metal layers between the metal layers shown in FIG. 1 are representatively shown as dots. Each of the metal layers includes an etch stop layer (ESL) and an intermetal dielectric (IMD) layer disposed on the ESL. With respect to each of the first interconnect structure 230 and the second interconnect structure 320, it can be said that ESLs interleave the IMD layers or that IMD layers interleave the ESLs. For example, the first interconnect structure 230 includes a first metal layer disposed in a first ESL 208 and a first IMD layer 210 and a second metal layer disposed in the second ESL 218 and the second IMD 220. The ESLs may include silicon carbide, silicon nitride or silicon oxynitride. The IMD layers may include silicon oxide, tetraethylorthosilicate (TEOS) oxide, un-doped silicate glass (USG), or doped silicon oxide such as borophosphosilicate glass (BPSG), fused silicate glass (FSG), phosphosilicate glass (PSG), boron doped silicate glass (BSG), low-k dielectric material, other suitable dielectric material, or combinations thereof. Example low-k dielectric materials include carbon doped silicon oxide, Xerogel, Aerogel, amorphous fluorinated carbon, benzocyclobutene (BCB), or polyimide.

Each of the metal layers of the first interconnect structure 230 and the second interconnect structure 320 includes a plurality of vertically extending vias and horizontally metal lines. For example, the first metal layer in the first interconnect structure 230 includes a first via 212 and a first metal line 214 and the second metal layer in the first interconnect structure 230 includes a second via 222 and a second metal line 224. The contact vias and metal lines in the first interconnect structure 230 and the second interconnect structure 320 may include copper (Cu), tantalum (Ta), nickel (Ni), cobalt (Co), aluminum (Al), or a combination thereof. In one embodiment, the contact vias, metal lines, and the top metals may include copper (Cu). While not explicitly shown, the contact vias, metal lines and top metal features may further include a barrier layer to interface the oxygencontaining IMDs. The barrier layer may include titanium nitride (TiN), tantalum nitride (TaN), manganese nitride (MnN), or other transition metal nitride.

The first die 200 includes through vias 232 extending through a substantial thickness of the first interconnect structure 230 to electrically couple to a first hybrid bond layer (to be described further below) of the first die 200. The second die 300 further include backside through-substrate vias (BTSV) 308 extending through the second substrate 302 that provide electrical communication between a metal layer in the first interconnect structure 230 on a front side of the second substrate 302 and an under bump metallization (UBM) feature 332 on a back side of the second substrate 302. A passivation layer 330 is disposed over the UBM feature 332. Openings 334 are formed in the passivation layer 330 to expose portions of the UBM feature 332. While not explicitly shown in the figures, bump and solder features may be formed in the openings 334. The device package 100 may be bonded to another die or a PCB by way of the solder features. The through vias 232 and the BTSVs 308 may be spaced apart from the first interconnect structure 230, the second interconnect structure 320, or the second substrate 302 by an insulation layer 233, which may include silicon oxide, silicon nitride, silicon oxynitride, or a suitable dielectric material. The through vias 232 and the BTSVs 308 may include a metal fill layer and a barrier layer spacing the metal fill layer from the insulation layer. In some instances, the barrier layer may include titanium nitride, tantalum nitride, or tungsten nitride and the metal fill layer may include copper.

The first die 200 includes a first hybrid bond layer 250 that includes a first bond feature 236 embedded in a first dielectric layer 240. The second die 300 includes a second hybrid bond layer 340 that includes a second bond feature 316 embedded in a second dielectric layer 324. One of the functions of the first hybrid bond layer 250 and the second hybrid bond layer 340 is to provide an aligned communication interface and an aligned hybrid bonding interface. The first die 200 and the second die 300 may have different top metal patterns. That is, when the first die 200 is flipped upside down, the top metal features on the first die 200 will not align with the top metal features on the second die 300. The first hybrid bond layer 250 and the second hybrid bond layer 340 redirect patterns of the top metal features on the first die 200 and the second die 300 to achieve direct wafer-to-wafer or die-to-die communication. At the same time, the exposed surfaces of the first dielectric layer 240 and the second dielectric layer 324 are aligned as well. Additionally, direct wafer bonding requires a high level of wafer surface planarity and a high density of dummy and functional bonding metal features. The top metal layers of the first die 200 and the second die 300 may not have the requisite metal feature density for direct wafer bonding processes. The first bond feature 236 and the second bond feature 316 may be included to boost the metal feature density at the bonding interface. The first dielectric layer 240 and the second dielectric layer 324 may have a composition similar to the IMD layers described above. The first bond feature 236 and the second bond feature 316 may include copper (Cu), tantalum (Ta), nickel (Ni), cobalt (Co), aluminum (Al), a combination thereof, or an alloy thereof. In one embodiment, the first bond feature 236 and the second bond feature 316 may include copper (Cu).

Referring still to FIG. 1, the first die 200 further includes a first bond contact 234 disposed in a third dielectric layer 238 and the second die 300 further includes a second bond contact 314 disposed in a fourth dielectric layer 322. The first bond contact 234 and the third dielectric layer 238 may be collectively referred to as a first bond contact layer 235. The second bond contact 314 and the fourth dielectric layer 322 may be collectively referred to as a second bond contact layer 315. In FIG. 1, the first bond contact 234 is disposed directly below and in contact with the first bond feature 236. Similarly, the second bond contact 314 is disposed directly above and in contact with the second bond feature 316. In some embodiments represented in FIG. 1, the first bond contact 234, the first bond feature 236, the second bond feature 316, and the second bond contact 314 are substantially aligned along the Z direction. In the depicted embodiments, the first bond contact 234, the first bond feature 236, the second bond feature 316, and the second bond contact 314 are substantially coterminous along the X direction. As will be described further below, the vertically aligned first bond contact 234, first bond feature 236, second bond feature 316, and second bond contact 314 form a passive device structure and their vertical stacking and physical contact provide an enlarged cross-section to reduce resistance of electrical current in the passive device. A fragmentary perspective view of the first bond contact layer 235 and the second bond contact layer 315 is shown in FIG. 3. As shown in FIG. 3, the first bond contact 234 and the second bond contact 314 are elongated and resemble metal lines.

In an example process to bond the second die 300 to the first die 200, surfaces of the second bond feature 316, the second dielectric layer 324, the first bond feature 236, and the first dielectric layer 240 are cleaned to remove organic and metallic contaminants. For example, a sulfuric acid hydrogen peroxide mixture (SPM), a mixture of ammonium hydroxide and hydrogen peroxide (SC1), or both may be used to remove organic contaminants on surfaces of the second bond feature 316, the second dielectric layer 324, the first bond feature 236, and the first dielectric layer 240. A mixture of hydrochloric acid and hydrogen peroxide (SC2) may be used to remove metallic contaminants. Besides cleaning, surfaces of the second bond feature 316, the second dielectric layer 324, the first bond feature 236, and the first dielectric layer 240 may be treated by an argon plasma or a nitrogen plasma to activate the surfaces thereof. After the second bond feature 316 is aligned with the first bond feature 236, an anneal is performed to promote the van der Waals force bonding of the first dielectric layer 240 and the second dielectric layer 324 as well as the surface-activated bonding (SAB) of the first bond features 236 and the second bond features 316. In some instances, the anneal includes a temperature between about 200° C. and about 300° C.

Reference is now made to FIG. 2, which provides a top view of the device package 100 along a top surface of the second dielectric layer 324. As shown in FIG. 2, the second bond contact 314, the second bond feature 316, the first bond feature 236, and the first bond contact 234 are in vertical alignment to form a first passive device 400. In some embodiments represented in FIG. 2, the first passive device 400 has a concentric square spiral shape along the X-Y plane. That is, the first passive device 400 extends two-dimensionally along the X-Y plane and has a two-dimensional structure. The concentric square spiral shape of the first passive device 400 constitutes a coil and the first passive device 400 may be an inductor. Each of the second bond contact 314, the second bond feature 316, the first bond feature 236, and the first bond contact 234 is a coil having a concentric square spiral shape along the X-Y plane. The four coils formed from the second bond contact 314, the second bond feature 316, the first bond feature 236, and the first bond contact 234 are vertically stacked and in contact with one another. FIG. 1 is a fragmentary cross-sectional view of the device package 100 along line A-A' shown in FIG. 2. It can be seen that line A-A' cuts cross the first passive device 400 six times, hence six vertically aligned stack structures of bond features and bond contacts shown in FIG. 1. It should be understood that the six vertical stack structures shown in FIG. 1 are parts of a continuous concentric square spiral shape structure shown in FIG. 2.

Fragments of the first bond contact 234, the first bond feature 236, the second bond feature 316, and the second bond contact 314 in the first passive device 400 are enlarged and shown in a fragmentary perspective view in FIG. 3. Each of the first bond feature 236 and the second bond feature 316 includes a first thickness T1 along the Z direction. Each of the first bond contact 234 and the second bond contact 314 includes a second thickness T2 along the Z direction. The first thickness T1 is greater than the second thickness T2 to maintain shapes of the trench for the first bond feature 236 and the second bond feature 316. The first thickness T1 may be between about 200 nm and about 400 nm and the second thickness T2 may be between about 50 nm and about 150 nm. This thickness range is not trivial. When the first thickness T1 is smaller than 200 nm, the resistance in the first passive device 400 may be too high. When the first thickness T1 is greater than 400 nm, the thicker first hybrid bond layer 250 and second hybrid bond layer 340 may result in increased stress and cause wafer warpage. A total thickness TT of the first bond contact 234, the first bond feature 236, the second bond feature 316, and the second bond contact 314 may between about 500 nm and about 1100 nm.

Reference is still made to FIG. 2. Besides the first passive device 400, the first hybrid bond layer 250 and the second hybrid bond layer 340 also include bond pad structures 500. Compared to the first passive device 400, each of the bond pad structures 500 does not curl into a square spiral shape or is elongated along a direction. FIG. 4 illustrates an enlarged perspective view of a bond pad structure 500, which is also disposed within the first dielectric layer 240, the second dielectric layer 324, the third dielectric layer 238, and the fourth dielectric layer 322. Each of the bond pad structures 500 includes a first bond pad 2360 disposed in the first dielectric layer 240, a second bond pad 3160 disposed in the second dielectric layer 324. A first bond pad contact 242 is disposed within the third dielectric layer 238 such that the first bond pad contact 242 is directly below and in contact with the first bond pad 2360. A second bond pad contact 318 is disposed within the fourth dielectric layer 322 such that the second bond pad contact 318 is directly above and in contact with the second bond pad 3160. In FIG. 4, the first bond pad contact 242 and the third dielectric layer 238 may be collectively referred to as a third bond contact layer 243. The second bond pad contact 318 and the fourth dielectric layer 322 may be collectively referred to as a fourth bond contact layer 319. A fragmentary perspective view of the third bond contact layer 243 and the fourth bond contact layer 319 is shown in FIG. 4. Compared with the first bond contact 234 and the second bond contact 314 in FIG. 3, the first bond pad contact 242 and the second bond contact 318 in FIG. 4 are smaller than the first bond pad 2360 and the second bond pad 3160 and resemble vias. In some embodiments, while the first bond pad 2360 and the second bond pad 3160 are substantially aligned along the Z direction to achieve satisfactory hybrid bonding, the first bond pad contact 242 and the second bond pad contact 318 are substantially smaller than the first bond pad 2360 and the second bond pad 3160 in terms of both area and dimension. In the depicted embodiment, each of the first bond pad 2360 and the second bond pad 3160 has a first width W1 along the X direction and each of the first bond pad contact 242 and the second bond pad contact 318 has a second width W2 along the X direction. In embodiments where the bond pads and bond pad contacts are formed using dual damascene process, the second width W2 is smaller than or equal to the first width W1 to ensure that the deposition of the bond pad contacts are not blocked or hindered. In some instances, a ratio of the first width W1 to the second width W2 may be between about 1.5 and 3.

In FIG. 1, the device package 100 is illustrated to include the first die 200 that includes a DTC structure 207 and the second die 300 that includes transistors. The first passive device 400, which may be an inductor, is integrated in the first hybrid bond layer 250 and the second hybrid bond layer 340 used to bond the first die 200 and the second die 300 by way of hybrid bonding. In at least some instances, the device package 100 as a whole may function as a voltage regulator. A circuit diagram of such a voltage regulator is schematically shown in FIG. 5. The second die 300 may function as a power management logic circuit 300. The first passive device 400 functions as an inductor 400. The first die 200, with the DTC structure 207, may function as a capacitor 200. When functionally connected as shown in FIG. 5, the power management logic circuit 300 receives a digital input voltage Vdio and output a core voltage to supply to a central processing unit (CPU) or a graphics processing unit (GPU). It is noted that the voltage regulator circuit diagram shown in FIG. 5 is only illustration purposes. Other voltage regulator schemes or circuits are possible. It should also be understood that the device package 100 does not have to be a voltage regulator for the first passive device 400 to be applicable. The first passive device 400, or other alternative passive device described herein, may be applicable to any hybrid bonding layers between two dies that are bonded together by way of hybrid bonding or direct bonding.

The passive devices according to the embodiments of the present disclosure may have different shapes and configurations, some of which are quite different from the first passive device 400 shown in FIGS. 1 and 2. FIGS. 6 and 7 illustrate a fragmentary cross-sectional view and a top view of a second passive device 402. The second passive device 402 may include at least one continuous square zigzag pattern that is formed of vertically aligned first bond feature 236, the second bond feature 316, the first bond contact 234, and the second bond contact 314. That is, a section of the second passive device 402 may be representatively shown in the perspective view in FIG. 3. As described above, the first bond feature 236, the second bond feature 316, the first bond contact 234, and the second bond contact 314 are substantially vertically aligned to boost the cross-sectional area of the second passive device 402. Compared to the concentric square spiral shape of the first passive device 400, the square-zigzag-shape second passive device 402 has a smaller inductance but is more suitable for high speed application. In some embodiments represented in FIG. 7, the second passive device 402 may include a first type 402A and a second type 402B. While the first type 402A and the second type 402B have substantially the same length on the X-Y plane, the first type 402A provides additional opening to accommodate bond pad structures 500. As the bond pad structure 500 in FIG. 7 is similar to the bond pad structure 500 shown in FIG. 4, detailed description of the bond pad structure 500 is omitted for brevity. The cross-sectional view shown in FIG. 6 extends along line B-B' in FIG. 7. Because line B-B' cuts across three (3) bond pad structures 500 and five (5) lines of second passive device 402, FIG. 6 shows five (5) cross-sections of the second passive device 402 and three (3) bond pad structures 500.

FIGS. 8 and 9 illustrate a fragmentary cross-sectional view and a top view of a third passive device 404. The third passive device 404 may include a plurality of parallel-extending stripes 4040 that are spaced such that the stripes 4040 are not interleaved by any bond pad structures 500. Each of the plurality of stripes 4040 in the third passive device 404 includes vertically aligned first bond feature 236, second bond feature 316, first bond contact 234, and second bond contact 314. That is, a section of the third passive device 404 may be representatively shown in the perspective view in FIG. 3. As described above, the first bond feature 236, the second bond feature 316, the first bond contact 234, and the second bond contact 314 are substantially vertically aligned to boost the cross-sectional area of the third passive device 404. Compared to the first passive device 400 or the second passive device 402, the stripe-shape third passive device 404 has a smaller inductance but is more suitable for high speed application due to smaller capacitive coupling. The plurality of stripes 4040 in the third passive device 404 are closely spaced such that none of the bond pad structures 500 is disposed between two adjacent stripes 4040. As the bond pad structure 500 in FIG. 9 is similar to the bond pad structure 500 shown in FIG. 4, detailed description of the bond pad structure 500 is omitted for brevity. The cross-sectional view shown in FIG. 8 extends along line C-C' in FIG. 9. Because line C-C' cuts across six (6) stripes 4040 and one (1) bond pad structure 500, FIG. 8 shows six (6) cross-sections of the third passive device 404 and one (1) bond pad structure 500. It is noted that the third passive device 404 may include less or more than seven (7) stripes 4040.

FIGS. 10 and 11 illustrate a fragmentary cross-sectional view and a top view of a fourth passive device 406. The fourth passive device 406 may include a plurality of parallel-extending stripes 4040 that are interleaved by bond pad structures 500. Each of the plurality of stripes 4040 in the fourth passive device 406 includes vertically aligned first bond feature 236, second bond feature 316, first bond contact 234, and second bond contact 314. That is, a section of the fourth passive device 406 may be representatively shown in the perspective view in FIG. 3. As described above, the first bond feature 236, the second bond feature 316, the first bond contact 234, and the second bond contact 314 are substantially vertically aligned to boost the cross-sectional area of the fourth passive device 406. Compared to the first passive device 400, the second passive device 402, or even the third passive device 404, the fourth passive device 406 has an even smaller inductance but is more suitable for high speed application due to smaller capacitive coupling. The plurality of stripes 4040 in the fourth passive device 406 are spaced apart such that at least one bond pad structure 500 is disposed between two adjacent stripes 4040. As the bond pad structure 500 in FIG. 11 is similar to the bond pad structure 500 shown in FIG. 4, detailed description of the bond pad structure 500 is omitted for brevity. The cross-sectional view shown in FIG. 10 extends along line D-D' in FIG. 11. Because line D-D' cuts across four (4) stripes 4040 and four (4) bond pad structures 500, FIG. 10 shows four (4) cross-sections of the fourth passive device 406 and four (4) bond pad structures 500. It is noted that the fourth passive device 406 may include less or more than four (4) stripes 4040.

In one exemplary aspect, the embodiments of the present disclosure is directed to a semiconductor device. The semiconductor device includes a first die and a second die. The first die includes a first bonding layer that includes a first dielectric layer and a first metal coil embedded in the first dielectric layer. The second die includes a second bonding layer that includes a second dielectric layer, and a second metal coil embedded in the second dielectric layer. The second bonding layer is bonded to the first bonding layer such that the first dielectric layer is bonded to the second dielectric layer and the first metal coil is bonded to the second metal coil.

In some embodiments, the first metal coil is aligned with the second metal coil. In some instances, the first die further includes a third metal coil aligned and in contact with the first metal coil and the second die further includes a fourth metal coil aligned and in contact with the second metal coil. In some implementations, a thickness of the first metal coil is greater than a thickness of the third metal coil and a thickness of the second metal coil is greater than a thickness of the fourth metal coil. In some embodiments, the thickness of the first metal coil is between about 200 nm and about 400 nm and the thickness of the third metal coil is between about 50 nm and about 150 nm. In some embodiments, each of the first metal coil and the second metal coil includes a concentric square spiral shape. In some instances, each of the first metal coil and the second metal coil includes a square zigzag shape. In some embodiments, the first die includes a first interconnect structure and the first die further includes a through via extending through the first interconnect structure to couple to an end of the first metal coil.

In another exemplary aspect, the embodiments of the present disclosure are directed to a device structure. The device structure includes a first die, a second die and an inductor structure. The first dies includes a first substrate and a first interconnect structure disposed over the first substrate along a direction and the second die includes a second interconnect structure disposed on the first interconnect structure along the direction and a second substrate disposed over the second interconnect structure. The inductor structure is disposed at an interface between the first interconnect structure and the second interconnect structure along the direction.

In some embodiments, the interface extends along a plane and the inductor structure includes a two-dimensional structure extending along the plane. In some implementations, the two-dimensional structure includes a square spiral shape. In some implementations, the two-dimensional structure includes a square zigzag shape. In some instances, the inductor structure includes a plurality of metal layers stacked one over another along the direction. In some embodiments, the plurality of metal layers include an even number of metal layers, a first half of the plurality of metal layers are disposed in the first interconnect structure, and a second half of the plurality of metal layers are disposed in the second interconnect structure. In some embodiments, the device structure further includes a bond pad structure at an interface between the first interconnect structure and the second interconnect structure. The bond pad structure includes two bond pads sandwiched between two vias.

In yet another exemplary aspect, the embodiments of the present disclosure are directed to a method. The method includes receiving a first die that includes a first semiconductor substrate, a first interconnect structure disposed over the first semiconductor substrate, a first dielectric layer over the first interconnect structure, and a first metal pattern disposed in the first dielectric layer and receiving a second die that includes a second semiconductor substrate, a second interconnect structure disposed over the second semiconductor substrate, a second dielectric layer disposed over the second interconnect structure, and a second metal pattern disposed in the second dielectric layer. The method further includes bonding the second die to the first die such that the first dielectric layer is bonded to the second dielectric layer and the first metal pattern is bonded to the second metal pattern.

In some embodiments, the first metal pattern and the second metal pattern include copper (Cu), tantalum (Ta), nickel (Ni), cobalt (Co), or aluminum (Al). In some implementations, the first metal pattern includes a concentric square spiral shape. In some instances, the first metal pattern includes a square zigzag shape. In some embodiments, the first die further includes a third metal pattern in contact and aligned with the first metal pattern, the second die further includes a fourth metal pattern in contact and aligned with the second metal pattern, a thickness of the third metal pattern is smaller than a thickness of the first metal pattern, a thickness of the fourth metal pattern is smaller than a thickness of the second metal pattern.

The foregoing outlines features of several embodiments so that those skilled in the art may better understand the aspects of the embodiments of the present disclosure. Those skilled in the art should appreciate that they may readily use the embodiments of the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the embodiments of the present disclosure, and that they may make various changes, substitutions, and alterations herein without departing from the spirit and scope of the embodiments of the present disclosure.

What is claimed is:

1. A device structure, comprising:

a first die comprising a first substrate and a first interconnect structure disposed over the first substrate along a direction;

a second die comprising a second interconnect structure bonded to the first interconnect structure along the direction at a bonding interface and a second substrate disposed over the second interconnect structure; and an inductor structure disposed at the bonding interface between the first interconnect structure and the second interconnect structure along the direction, wherein the first substrate comprises a deep trench capacitor (DTC) structure, wherein the second substrate comprises a plurality of transistors, wherein the inductor structure is vertically disposed between the DTC structure and the plurality of transistors.

2. The device structure of claim 1, wherein the bonding interface extends along a plane, wherein the inductor structure comprises a two-dimensional structure extending along the plane.

3. The device structure of claim 2, wherein the two-dimensional structure comprises a square spiral shape.

4. The device structure of claim 2, wherein the two-dimensional structure comprises a square zigzag shape.

5. The device structure of claim 1, wherein the inductor structure comprises a plurality of metal layers stacked one over another along the direction.

6. The device structure of claim 5, wherein the plurality of metal layers comprise an even number of metal layers, wherein a first half of the plurality of metal layers are disposed in the first interconnect structure, wherein a second half of the plurality of metal layers are disposed in the second interconnect structure.

7. The device structure of claim 5, further comprising:

a bond pad structure at the bonding interface between the first interconnect structure and the second interconnect structure, wherein the bond pad structure comprises two bond pads sandwiched between two vias.

8. A device structure, comprising:

a first die comprising a first substrate and a first interconnect structure disposed over the first substrate along a direction;

a second die comprising a second interconnect structure disposed on the first interconnect structure along the direction and a second substrate disposed over the second interconnect structure; and an inductor structure disposed at an interface between the first interconnect structure and the second interconnect structure along the direction, wherein the first substrate comprises a plurality of deep trench capacitor (DTC) structures, wherein the DTC structure comprises a lower electrode, a dielectric layer and an upper electrode disposed over a plurality of trenches in the first substrate, wherein the upper electrode is electrically coupled to the inductor structure by way of a through via that extends continuously through the first interconnect structure, wherein the inductor structure comprises a plurality of metal layers stacked one over another along the direction, wherein the plurality of metal layers comprise:

a first bond contact in the first interconnect structure, a first bond feature in the first interconnect structure and disposed over the first bond contact, a second bond feature in the second interconnect structure and interfacing the first bond feature, and a second bond contact in the second interconnect structure and disposed over the second bond feature, wherein the first bond contact, the first bond feature, the second bond feature, and the second bond contact are aligned along the direction to provide an enlarged cross-section.

9. The device structure of claim 8, wherein the first substrate and the second substrate comprise silicon (Si), a compound semiconductor, an alloy semiconductor, or a combination thereof.

10. The device structure of claim 9, wherein the inductor structure comprises a concentric square spiral shape.

11. The device structure of claim 9, wherein the inductor structure comprises a square zigzag shape.

12. The device structure of claim 9, wherein the second substrate comprises a plurality of transistors.

13. The device structure of claim 12, wherein the second die further comprises a through via extending through the second substrate.

14. The device structure of claim 8, wherein the first substrate comprises a deep trench capacitor (DTC) structure.

15. The device structure of claim 14, wherein the DTC structure comprises:

a lower electrode;

a dielectric layer over the lower electrode; and an upper electrode over the dielectric layer.

16. The device structure of claim 15, wherein the upper electrode and the lower electrode comprise doped silicon, polysilicon, copper, tungsten, an aluminum copper alloy, titanium, titanium nitride, tantalum, tantalum nitride, a combination thereof, wherein the dielectric layer comprises hafnium oxide, aluminum oxide, zirconium oxide, or a combination thereof.

17. A device structure, comprising:

a first die comprising a first silicon substrate and a first interconnect structure disposed over the first silicon substrate along a direction, the first interconnect structure comprising a first bond feature; and a second die comprising a second interconnect structure disposed on the first interconnect structure along the direction and a second silicon substrate disposed over the second interconnect structure, the second interconnect structure comprising a second bond feature, wherein the first bond feature is bonded to the second bond feature to form an inductor structure disposed at an interface between the first interconnect structure and the second interconnect structure along the direction, wherein the first silicon substrate comprises a deep trench capacitor (DTC) structure, wherein the inductor structure is electrically coupled to the DTC structure, wherein the interface extends along a plane, wherein the inductor structure comprises a two-dimensional structure extending along the plane.

18. The device structure of claim 17, wherein the inductor structure comprises a concentric square spiral shape or a square zigzag shape.

19. The device structure of claim 17, wherein the inductor structure further comprises a first bond contact disposed in the first interconnect structure and a second bond contact disposed in the second interconnect structure, wherein the first bond feature, the second bond feature, the first bond contact, and the second bond contact are stacked one over another along the direction.

20. The device structure of claim 19, wherein the first bond feature, the second bond feature, the first bond contact, and the second bond contact are aligned along the direction.

* * * * *